United States Patent [19]

Schertler

[11] Patent Number: 5,549,435
[45] Date of Patent: Aug. 27, 1996

[54] CHAMBER AND A CHAMBER COMBINATION FOR A VACUUM FACILITY AND A METHOD FOR TRANSPORTING THROUGH AT LEAST ONE WORKPIECE

[75] Inventor: Roman Schertler, Wolfurt, Austria

[73] Assignee: Balzers Aktiengesellschaft, Liechtenstein

[21] Appl. No.: 131,539

[22] Filed: Oct. 5, 1993

[30] Foreign Application Priority Data

Oct. 6, 1992 [CH] Switzerland .............. 3120/92

[51] Int. Cl.$^6$ ........................... B65G 49/07
[52] U.S. Cl. .............. 414/217; 414/744.3; 414/939; 414/941
[58] Field of Search .................. 414/217, 732, 414/744.6, 744.8, 939, 941, 736, 744.2, 744.3; 221/237

[56] References Cited

U.S. PATENT DOCUMENTS

| | | |
|---|---|---|
| 3,968,885 | 7/1976 | Hassan et al. . |
| 4,047,624 | 9/1977 | Dorenbos .................. 414/939 X |
| 4,187,051 | 2/1980 | Kirsch et al. ................ 414/744.3 |
| 4,433,951 | 2/1984 | Koch et al. .................. 414/941 X |
| 4,542,712 | 9/1985 | Sato et al. ................... 414/217 X |
| 4,620,359 | 11/1986 | Charlton et al. .............. 414/744.2 X |
| 4,670,126 | 6/1987 | Messer et al. ................ 414/939 X |
| 4,778,332 | 10/1988 | Byers et al. .................. 414/941 X |
| 4,820,106 | 4/1989 | Walde et al. ................. 414/217 |
| 4,886,412 | 12/1989 | Wooding et al. ............... 414/217 X |
| 4,889,801 | 9/1989 | Helms et al. ................. 414/939 X |
| 4,915,564 | 4/1990 | Eror et al. ................... 414/736 X |
| 5,205,919 | 4/1993 | Zejda . |
| 5,310,410 | 5/1994 | Begin et al. . |
| 5,340,261 | 8/1994 | Oosawa et al. ................ 414/217 |
| 5,344,542 | 9/1994 | Maher et al. ................. 414/217 X |

FOREIGN PATENT DOCUMENTS

| | | |
|---|---|---|
| 0589416A1 | 3/1994 | European Pat. Off. . |
| 2445559 | 4/1975 | Germany . |
| 3714045 | 11/1987 | Germany . |
| 3716498 | 1/1988 | Germany . |
| 3912295 | 10/1990 | Germany . |
| 2054345 | 2/1981 | United Kingdom . |

*Primary Examiner*—James W. Keenan
*Attorney, Agent, or Firm*—Evenson, McKeown, Edwards & Lenahan

[57] ABSTRACT

A chamber for a vacuum facility comprises at least one opening for the through-transport of workpieces, particularly of circular-disk-shaped workpieces such as storage disks during their treatment, and a transport arrangement, which is movable in a driven manner for at least one workpiece. On the transport arrangement, at least one transport device with a holding device for at least one workpiece is swivellably disposed in a plane perpendicularly to the area of the opening such that the holding device, transported by the transport arrangement into the area of the opening, can be swivelled completely through the opening. Another chamber is arranged in which a rotatably disposed additional transport arrangement for the at least one workpiece is provided which has an axis of rotation that is in parallel to the swivel axis of the transport device. A method for transporting-through at least one disk-shaped workpiece from a respective fixed ring-shaped transport path through an opening inside a vacuum treatment facility, involves transporting the workpiece through radially with respect to the ring-shaped transport path.

30 Claims, 7 Drawing Sheets

CHAMBER AND A CHAMBER COMBINATION FOR A VACUUM FACILITY AND A METHOD FOR TRANSPORTING THROUGH AT LEAST ONE WORKPIECE

BACKGROUND AND SUMMARY OF THE INVENTION

The present invention relates to a chamber for a vacuum facility comprising at least one opening for the through-transport of workpieces, particularly of circular-disk-shaped workpieces, such as storage disks during their treatment, comprising a transport arrangement, which is movable in a driven manner, for at least one workpiece, to a chamber combination as well as to a method for transporting through at least one disk-shaped workpiece from a respective ring-shaped transport path through an opening inside a vacuum treatment facility.

It is known to transport disk-shaped workpieces, such as storage disks, including, for example, CD's, magnetic storage disks or magneto-optic storage disk, during their treatment in a vacuum treatment facility in which they are treated, for example, by means of non-reactive or reactive processes, such as etching, physical or chemical coating with or without glow discharge support, in a chamber by means of a driven movable transport arrangement along a moving path.

Normally, the workpieces which are transported by the transport arrangement in this manner are fed by a provided linear drive selectively to openings provided on the chamber in order to feed the workpieces in the course of their treatment to additional chambers and stations.

The expenditures for the implementation of linear drives which meet the condition of the vacuum process are relatively high in the case of a desired stroke. In view of the purity requirements to be met, considerable attention must be paid particularly to the formation of particles caused by abrasion.

It is an object of the present invention to provide a chamber of the initially mentioned type in the case of which, for the purpose of a desired stroke, for the charging of a chamber opening with a workpiece, the required expenditures are reduced significantly.

This is achieved by constructing the above-mentioned chamber on the transport arrangement, at least one transport device with a holding device for at least one workpiece is swivellably disposed in a plane perpendicularly to the area of the opening in such a manner that the holding device, transported by means of the transport arrangement into the area of the opening, can be swivelled completely through the opening.

By providing the above-mentioned transport arrangement, it becomes possible to continue to implement a desired moving path for the workpiece in the above-mentioned chamber. By the additional providing of the swivellably disposed transport arrangement with the workpiece holding device on the transport arrangement, a significant advantage is achieved: For sweeping through a curved transport path of a given stroke, a drive may be sufficient which requires considerably less expenditures and space than if the same stroke were to take place linearly. In an extreme case, a rotary drive may be used for the swivel motion. Also, a linear drive, which is changed into a swivel motion, must pass through a much shorter stroke in order to implement the stroke required for charging the opening with the workpiece in comparison to the stroke which a linear drive would have to carry out directly for the charging of the opening.

In a preferred embodiment, the mentioned holding device is constructed in the shape of tongs and can preferably be controlled for the gripping and releasing of a respective workpiece.

This has several advantages, specifically that, on the one hand, the workpiece remains free at least on two sides or even virtually on all sides also inside the holding device and therefore, if the opening of the chamber leads out into a treatment station, such as an etching or coating station, can be treated on two sides or even on all sides. Furthermore, this design is simple, particularly also as far as its releasing and gripping control is concerned.

In addition, as a result, the space required for the swivelling of the workpiece is at most increased insignificantly beyond that required anyway for the workpiece, which permits the optimal adapting of the above-mentioned opening essentially to the dimension of the workpiece to be transported through.

Often, transport arrangements are provided in transport chambers of vacuum treatment facilities whereby the workpiece is displaced at least also linearly to and from the opening to be serviced.

By arranging a swivel bearing for the transport device to be displaced perpendicularly to the area of the opening while being driven linearly, the possibility is created for utilizing an already provided linear drive for the swivel motion of the transport arrangement with the holding device. In addition, the conversion of also an only slight linear advance into a large-angle swivel motion and thus into a large stroke caused by this swivel motion is easy to implement.

Further, for the disk-shaped workpieces, the chamber is preferably constructed such that the disk surfaces of a workpiece held on the holding device are situated in one swivel plane and preferably the diameter of the opening in the swivel plane is considerably longer than in the direction of the swivel axis.

This results in the possibility of implementing the above-mentioned opening only insignificantly wider than given by the dimension of the thickness of the disk-shaped workpiece, which relates to important advantages, for example, with respect to the separation of the atmospheres of the spaces situated on both sides of the mentioned opening.

As mentioned above, as a result of the construction of the chamber according to one embodiment, it becomes possible in a simple manner to implement the swivel drive for the transport arrangement by the linear drive of the transport arrangement.

In addition, in this case the advantage of a linear stroke is maintained although it is relative small, specifically of being able to close off the respective serviced opening to the desired extent.

The suggested chamber may be coupled in a modular manner with one or several known transport chambers with at least two openings or one or several treatment stations, such as etching or coating stations, or with a feeding and a delivery lock-type pass-through chamber or a feeding/delivery lock-type pass-through chamber.

A chamber combination with the above-described chamber according to the invention is achieved by providing that, on its opening, another chamber is arranged in which a rotatably disposed additional transport arrangement for at least one workpiece is provided which has an axis of rotation that is in parallel to the swivel axis of the transport device.

Because of the fact that the swivel axis of the transport arrangement is placed in parallel to the axis of rotation of the additional transport arrangement in the additional chamber provided on the combination, it becomes possible to carry out the guiding of the workpieces through the connection opening essentially radially with respect to the swivel axis in the additional chamber.

Furthermore, because of the fact that the additional transport arrangement in the additional chamber has a majority of holding devices for the workpieces which are jointly rotatable about the above-mentioned axis of rotation essentially in the swivelling plane of the transport arrangement, it becomes possible to feed, from the former chamber, one workpiece after the other to the additional transport arrangement and to return one workpiece after the other through the above-mentioned opening.

As mentioned above, it is known to transport disk-shaped workpieces, such as storage disks, for example, CD's or magnetic storage disks or magneto-optic storage disk, in a vacuum facility on a ring-shaped transport path by means of a transport arrangement. In this respect, reference can be made, for example, to U.S. Patent Document U.S. Pat. No. 3,856,654, German Patent Documents DE-PS 24 54 544, DE-OS 39 12 295 and DE-OS 40 09 603, DE-OS 37 16 498 and European Patent Document EP-A 0 389 820. In this case, the workpieces are moved axially with respect to the ring-shaped transport path through an opening opposite the ring-shaped transport path, for example, in the treatment position.

In the case of a design of a vacuum facility chamber in which, as mentioned above, the transport path of the disk-shaped workpieces is ring-shaped and the workpieces are transported axially in predetermined angular positions of the circular path through provided openings, there is however, an interaction between the depth of such a chamber measured in the axial direction and the possible stroke by means of which the workpieces can be axially transported through.

The reason is that, if the chamber in which the ring-shaped transport path is passed, is to be constructed in a compact and flat manner while including additional axially arranged aggregates, the possible axial stroke will remain small. Analogously, the overall height will become large if considerable travelling paths are to be implemented. In this case, it should be taken into account that if the workpieces are arranged such that they pass through a ring-shaped transport path, the overall height of the respective chamber viewed in the axial direction will have no influence on the number of workpieces arranged along the ring but that this number is determined only by the radial dimension of such a chamber and therefore of the ring-shaped transport path along which additional workpieces are arranged.

It is another object of the present invention to provide a transporting method which eliminates the above-mentioned difficulties.

Because of the fact that the disk-shaped workpieces, with respect to their ring-shaped transport path, are transported radially through the opening, the radial dimension of the ring-shaped transport path can be utilized for the implementation of a required radial stroke, and the circumference of the ring-shaped transport path and of the corresponding chamber can also be used for the arranging of openings.

The implementation of this method according to the invention may take place in many ways, for example, by means of radially acting rams which are fixedly or swivellably aligned with the corresponding openings. However, preferably this method will be implemented by means of the swivellable transport arrangement provided on the initially mentioned chamber according to the invention.

If the transport arrangement provided on the above-mentioned chamber is constructed such that the workpieces are conveyed on a circular path in the chamber, the swivellable transport devices on the transport arrangement will, when it is in each case aligned with one opening, convey a workpiece radially with respect to the axis of rotation of the transport arrangement out of the opening and return it through the opening.

Embodiments of the invention will be explained in the following by means of figures.

DETAILED DESCRIPTION OF THE DRAWINGS

Figure 1:
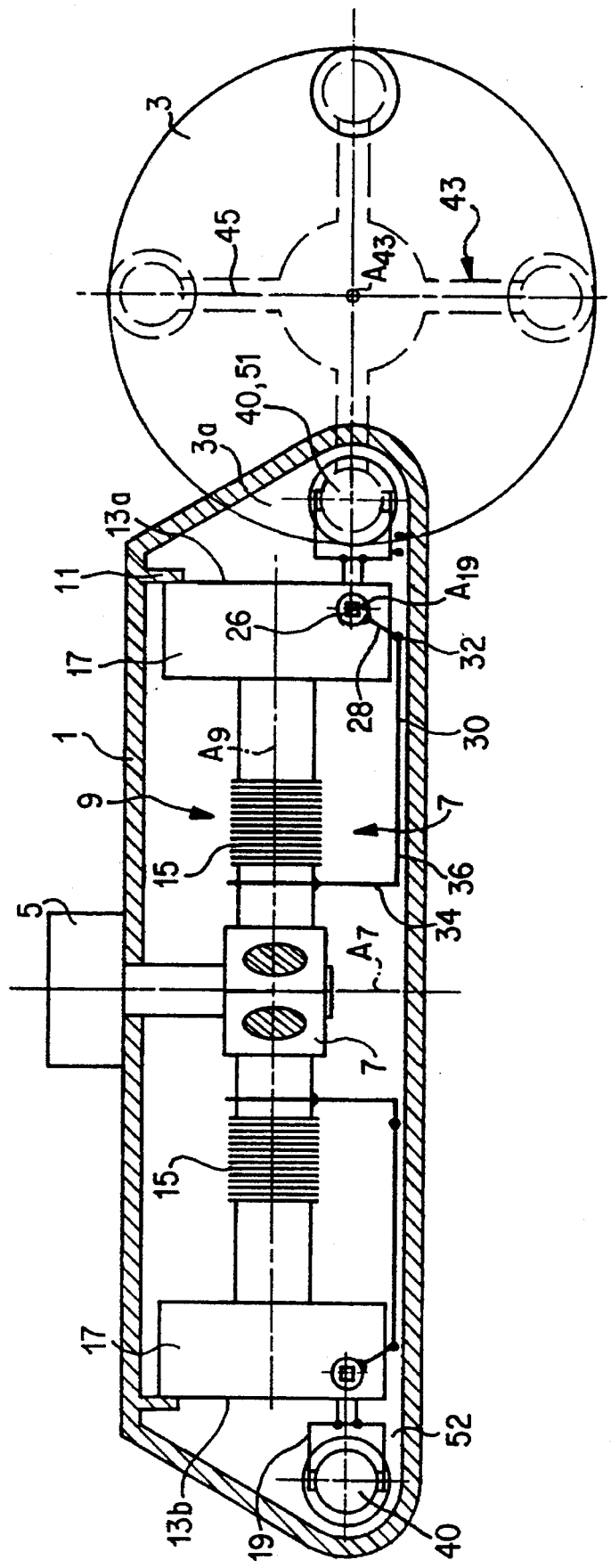
FIG. 1 is a schematic representation of a partially sectional view of a vacuum treatment facility, wherein the chamber according to the invention or the combination according to the invention are preferably used and the method according to the invention is implemented.
Figure 2A:
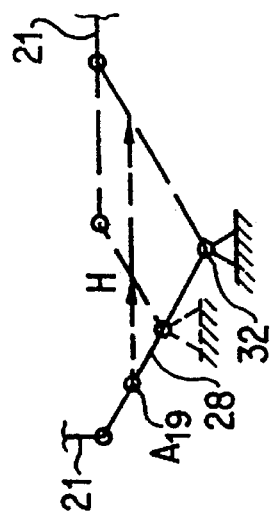
FIG. 2a is a kinematic diagram of a transfer arrangement with a smaller linear stroke than the arrangement of FIG. 2.
Figure 2:
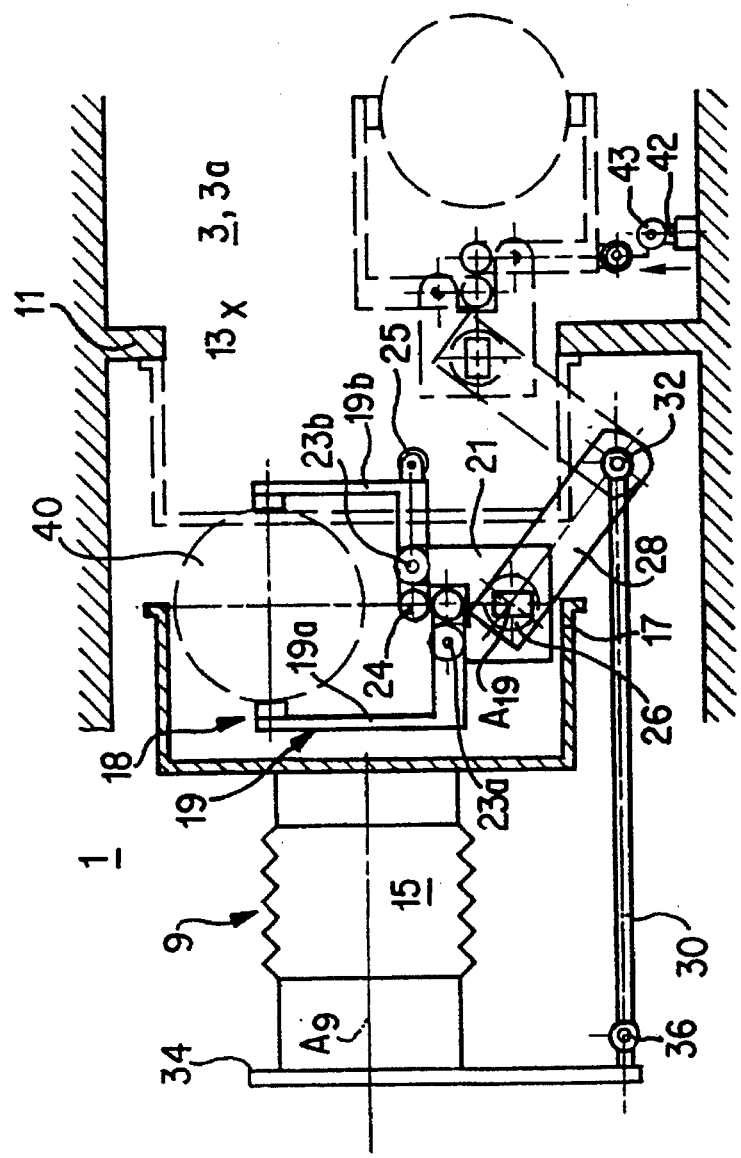
FIG. 2 an enlarged cut-out of a transfer arrangement on the facility according to FIG. 1.
Figure 3:
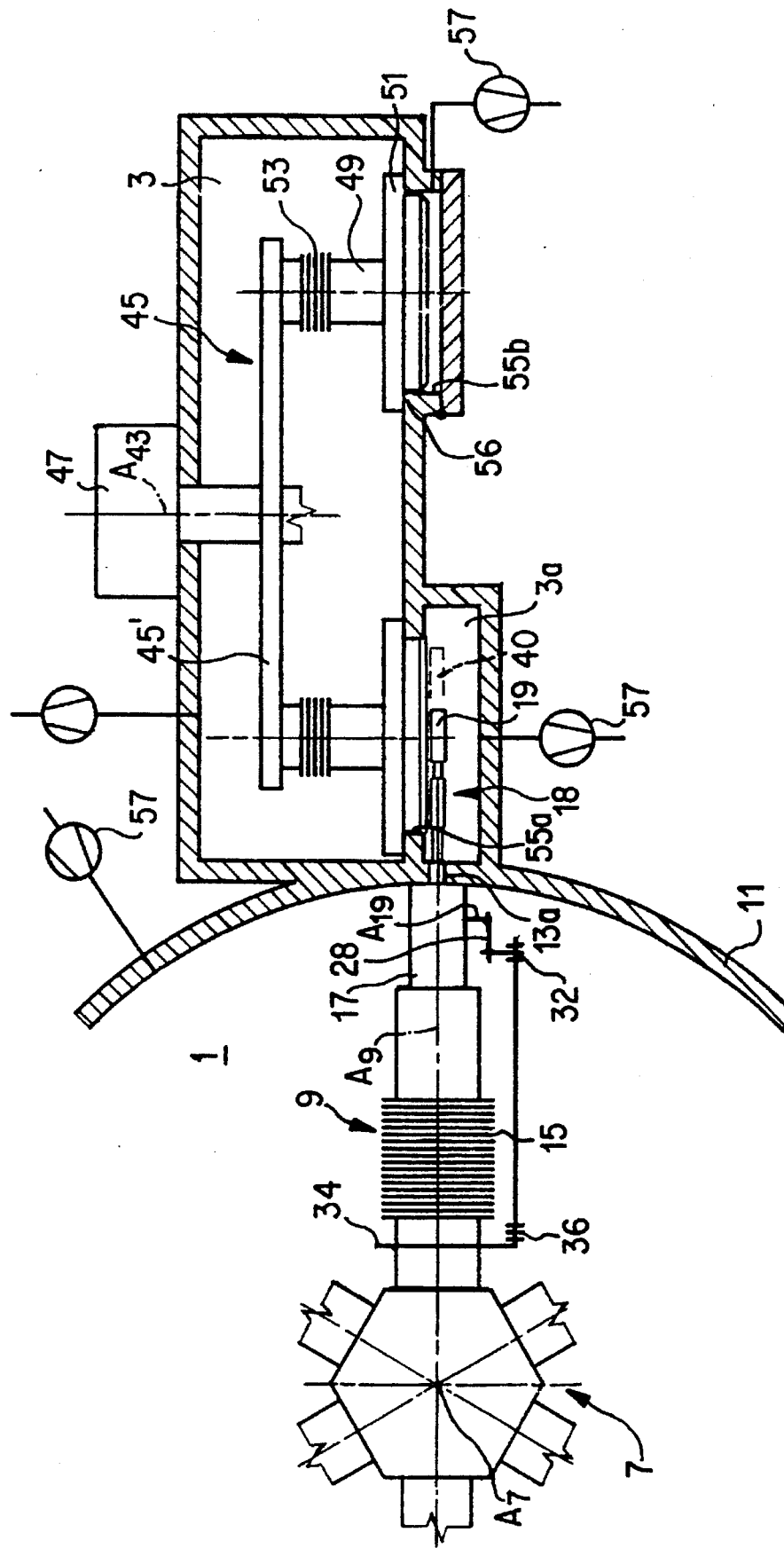
FIG. 3 is a schematic representation of a partially sectional top view of the facility.

FIGS. 1 to 3 are schematic representations of a preferred facility into which the invention is integrated. The facility comprises a chamber 1 and a chamber 3 as well as an intermediate chamber 3a which connects chambers 1 and 3.

A transport star 7, which is controlled in a driven manner by a motor 5 and has six arms 9, as illustrated in the example, is rotationally centrically disposed in the chamber 1. The transport star can be rotated about the axis $A_7$. The exterior wall 11 of the chamber 1 which is parallel to the axis $A_7$, has at least two openings 13a and 13b with which, by means of the rotating of the star 7, the axis $A_9$ of one of the arms 9 respectively is aligned. By means of drives (not shown) integrated on the transport star 7, the arms 9 can be linearly moved out and back radially in the direction of their axes $A_9$. The linear drive is sealed off in a vacuum-tight manner by means of bellows 15. On the end of the arms 9, that is, on the parts of the arms which can be moved radially with respect to the axis $A_7$, one transport bushing 17 respectively is mounted which is illustrated schematically in greater detail in FIG. 2 and which, as indicated by the comparison of FIG. 1 and FIG. 3, is considerably wider in the direction parallel to the axis $A_7$ than in the direction transversely to it, that is, in the azimuthal direction.

Correspondingly, the openings 13a and 13b are designed to be slot-shaped.

Viewed in the direction of the axis $A_7$, a transport device 18 rides in each bushing 7, is disposed so that it can be swivelled about an axis $A_{19}$ and has transport tongs 19 (FIG. 2) which are constructed as illustrated, for example, in FIG. 2. The tongs 19 comprise two tong arms 19a, 19b which are each disposed on a support part 21 so that they can be rotated about swivel axes 23a, b and engage in one another by way of rollers 24 and (not shown) are prestressed in a springy manner into the closed position illustrated in FIG. 2. On tong arm 19b, another actuating roller 25 is provided for the opening and closing release of the tongs.

As mentioned above, the transport device 18, which is formed by the tongs 19 and the support part 21, is swivellably disposed on the bushing 17. On a driving stub 26, which is non-rotatable on the transport device 18, a first lever 28 is non-rotatably disposed which is rotatably disposed on a second lever 30 in a bearing 32. The end of the lever 30, in turn, which faces away from the bearing 32 is rotationally disposed by way of a mounting plate 34 on the radially fixed arm part of the arm 9 on a bearing 36.

The above-described arrangement operates as follows:

Starting from the swivel position of the transport arrangement 18 according to FIG. 2 in a closed position of the tongs, for example, with a workpiece disk 40 in the tongs, the transport star 7 can be swivelled into arbitrary positions about its axis $A_7$. In this case, the bushings 13 are moved back toward the axis $A_7$ by means of the respective radial drives specific to the arms.

When now, as illustrated in FIG. 2, one of the openings, for example 13x, is to be serviced, the axis $A_9$ of one arm 9 and thus the swivel plane of the tongs 19 is aligned with the slot-shaped opening 13x. Now, by means of the drive assigned to the concerned arm 9, the bushing 17 is advanced toward the opening 13x. Because of the resulting linear movement of axis $A_{19}$ with the driving stub 26, the first lever 28 is swivelled about bearing 32; and because the lever 28 is non-rotatably disposed on the stub 26 and the latter is non-rotatable on the transport device 18, as indicated by an interrupted line in FIG. 2, the transport device 18 is swivelled through the opening 13x with the simultaneous linear displacement with the bushing 17. In this case, the bushing 17 rests on the exterior wall 11 of the chamber 1 and closes the opening 13x, according to the requirement of the separation of the two chambers 1 and 3, preferably tightly, if required, vacuum-tightly.

As illustrated in FIG. 2, the bushing 17 remains in the chamber 1, while the workpiece holding device formed by the tongs 19 is swivelled through the opening 13x completely into the chamber 3 or 3a.

For the required swivel movement of the transport device 18, FIG. 2 illustrates an unnecessarily long linear stroke of the bushing 17. However, as a person skilled in the art will immediately see, while also looking at the representation according to FIG. 2a, by means of the reduction of the length of the lever 28 between axis $A_{19}$ and link bearing 32, the same swivel motion of the support part 21 and therefore of the transport device 18 can be implemented by means of a considerably smaller linear stroke H.

Thus, by means of a virtually arbitrarily small linear stroke H and the corresponding minimalization of the driving and sealing elements to be provided for this purpose, the desired swivel movement can be implemented and, by means of it, as a result of the swivel radius of workpiece 40 about axis $A_{19}$, the desired stroke through opening 13x.

As illustrated schematically in FIG. 2, a ram 42 is arranged in chamber 3 or 3a whose roller 43, which is arranged on its end and is controlled by engaging on roller 25 on the tongs 19, opens up the tongs in order to release the workpiece 40.

In the preferred embodiment illustrated in FIGS. 1 to 3, the intermediate lock-type pass-through chamber 3a is provided between chamber 1 and chamber 3. The following description which concerns the chamber 3 will clearly describe the method of operation of the intermediate lock-type pass-through chamber 3a.

As illustrated particularly in FIG. 3, the chamber 3 comprises a transport star 45 with radial arms 45' which are rotationally driven about the axis $A_{43}$ by means of the motor 47 and on which, in parallel to the axis $A_{43}$, as illustrated, for example, four axial arms 49 project upward. On their ends, the arms 49 carry the transport plates 51 with (not shown), for example, mechanical, pneumatic or magnetic holding devices for workpieces, unless the axis $A_{43}$ is perpendicular. The plates 51 can be moved out and back linearly and in parallel to the axis $A_{43}$ by means of the arms 49 of drives sealed off by respective assigned bellows 53.

As illustrated, the chamber 3 has, for example, two openings 55a and 55b aligned with the circular ring through which the plates 51 pass during the rotation about the axis $A_{43}$. The plates 51 are constructed such that they move out toward a respective opening 55, close off the opening by means of sealing elements (not shown) in a tight or vacuum-tight manner. As, on the bushings 17 to the wall 11 of chamber 1, gap sealing devices may be sufficient for this purpose, unless a vacuum-tight sealing is required. Furthermore, the plates 51 project axially beyond the bordering parts 56 of the opening 55 out of the chamber 3, against which the plates 51 are placed in a sealing manner in the moved-out condition.

The conditions at the opening 55a which communicates with the opening 13a by way of the intermediate lock-type pass-through chamber 3a will be described in the following. After, according to FIG. 3, a disk-shaped workpiece 40 has been swivelled by means of the transport device 18 into the position illustrated by an interrupted line in FIG. 2, the bushing 17 is placed to the required extent in a sealing manner against the bordering of the opening 13a on the side of the chamber 1. By means of the controlled axial movingout of the arm 49 in chamber 3 which will then be assigned to the opening 55a, the plate 51 is placed to the required extent tightly against the bordering 56 of the opening and takes over, for example, magnetically, pneumatically, mechanically or driven by the force of gravity, the workpiece 40 which is released by the tongs 19 by the actuating of the ram 42 according to FIG. 2. The respective arm 49 can now be moved back.

As illustrated schematically at reference number 57, the chamber 3a as well as the chamber 1 and/or 3 may be pumped separately.

The workpiece transport through the intermediate locktype pass-through chamber 3a will therefore take place as follows:

To the required extent, tight sealing-off of the opening 13a by the bushing 17—tongs 19 empty; swivelling of an arm 49 with the workpiece on the plate 51 in the opening range of the opening 55a; axial advancing of the plate 51 with the workpiece 40 and, to the required extent, tight sealing-off of the opening 55a by plate 51; if necessary, pumping-out of the intermediate lock-type pass-through chamber 3a; taking-over of the workpiece by the tongs; swivelling-back of the transport device 18 with the simultaneous detaching of the bushing 17 from the bordering of the opening 13x; or to the required extent, the empty plate 51 tightly seals off the opening 55a; swivelling-in of an arm 9 with the bushing 17 and the workpiece 40 on tongs 19 by way of opening 13a; swivelling-out of tongs 19 with the workpiece with a simultaneous tight sealing-off, to the required extent, of the opening 13a by means of bushing 17; taking-over of the workpiece magnetically pneumatically, mechanically or driven by the force of gravity, by plate 51 in opening 55a; pumping-out of intermediate lock-type pass-through chamber 3a by means of pump 57; moving-back of plate 51 and continued rotation of the transport star 43.

This description illustrates clearly that the chamber 3a may operate as an intermediate lock-type pass-through chamber which can be pumped separately or which, because of its very low volume, by itself ensures a sufficient separation of the atmospheres of chambers 1 and 3. If no intermediate lock-type pass-through chamber 3a must be provided, the taking-over of the workpiece in the illustrated manner can take place directly in chamber 3 and the plates 51 would not exercise any sealing function at the transfer opening. In the illustrated embodiment, at the transfer connection 13a, 55a, the plate 51 acts as one lock-type pass-through valve and the bushing 17 acts as the other.

In the case of the illustrated preferred embodiment, the opening 55b is also constructed as a feeding/delivery pass-through lock. For this purpose, a cover, which can be closed off in a vacuum-tight manner, for example, against the normal atmosphere, is provided as a lock-type pass-through valve, and the plate 51 which is momentarily aligned with the opening 55b acts as the second lock-type pass-through valve.

Despite the extremely small volume of also this lock-type pass-through chamber, if necessary, a pump 57 may also be connected here for the purpose of a separate pumping of this lock-type pass-through chamber.

As mentioned above, the opening 13b of chamber 1 is serviced, as illustrated in FIG. 1, by the bushing 17 and the transport device 18 in the same manner as the above-described opening 13a of the mentioned chamber 1.

Outside chamber 1, for example, a treatment chamber, such as an etching chamber or a coating chamber 52, is arranged on this opening 13b. Because of the fact that the workpiece 40 by means of the tongs 19 is held and swivelled into the treatment chamber 52 in such a manner that it remains uncovered virtually on all sides by the holding device on the tongs, it is possible to treat the workpiece on such a treatment station 52 on all sides, particularly simultaneously on both its disk surfaces, as, for example, by means of the two-sided arranging of electrodes for the plasma etching of both above-mentioned surfaces and/or of magnetron atomization sources for their coating.

Figure 3A:
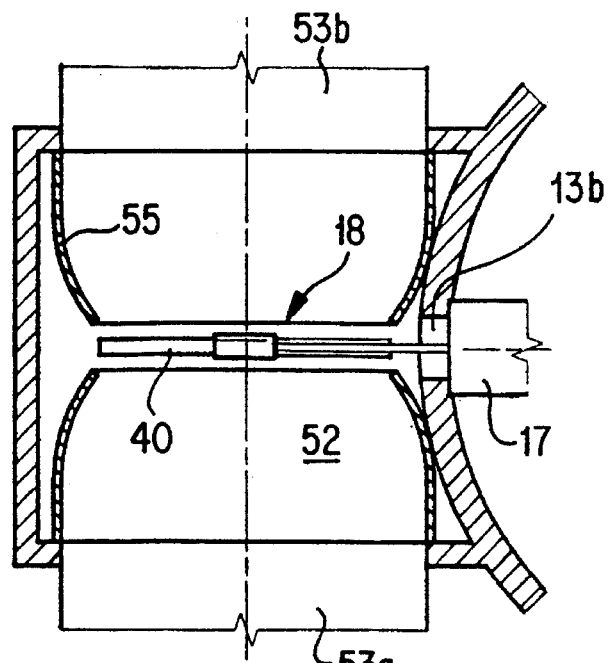
FIG. 3a is a schematic representation of a sectional view of an etching chamber arranged on the facility according to FIG. 1 to 3 for the double-sided sputtering of disk-shaped workpieces.

FIG. 3a is a sectional and schematic top view of an embodiment of chamber 52 comprising two sputtering sources 53a and 53b as well as shrouds 55. The disk-shaped workpiece 40 is swung between sources 53a and b and is treated on both sides by sources 53a, b.

At a chamber of this type, a simultaneous two-sided coating of workpieces, for example, may also be carried out, as known from German Patent Document DE-PS 39 31 713.

In the following, the principles of various chamber types will now be discussed, in the case of which all transported workpieces are rotated about an axis of rotation which is offset with respect to the workpieces. Furthermore, a differentiation between cases is carried out, specifically as to whether the workpieces may in addition be displaced in the radial direction, in the axial direction or combined, into the radial and axial direction.

1. Rotary transport chamber, on which workpieces are rotationally transported individually and are displaced radially with respect to the axis of rotation:

Such a chamber is formed by chamber 1 according to FIG. 1, on which the workpieces 40, particularly by means of the linear drive of the arms 9, are individually displaced radially toward the openings 13.

2. Rotary transport chambers, in which all workpieces are arranged on a rotating carrousel and are individually displaced radially with respect to the axis of rotation of the carrousel.

Figure 4:
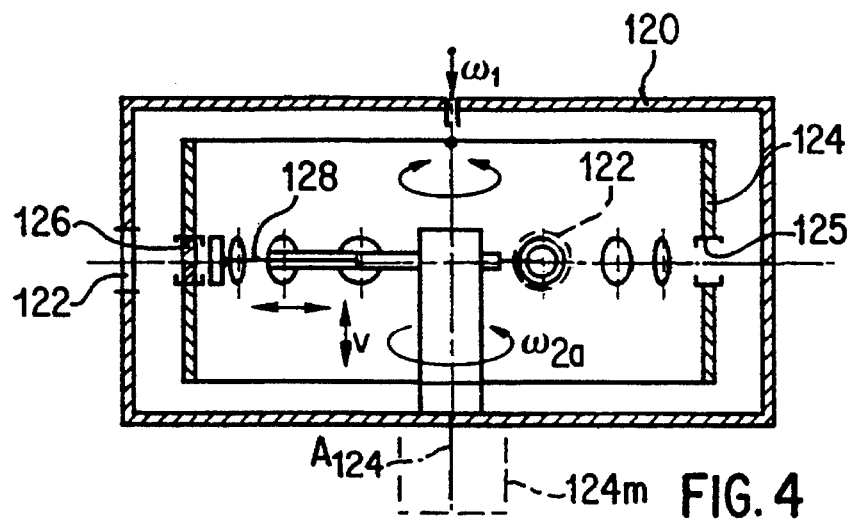
FIG. 4 is a schematic representation of a partially longitudinal sectional view of a carrousel transport chamber with radially serviced chamber openings.
Figure 5:
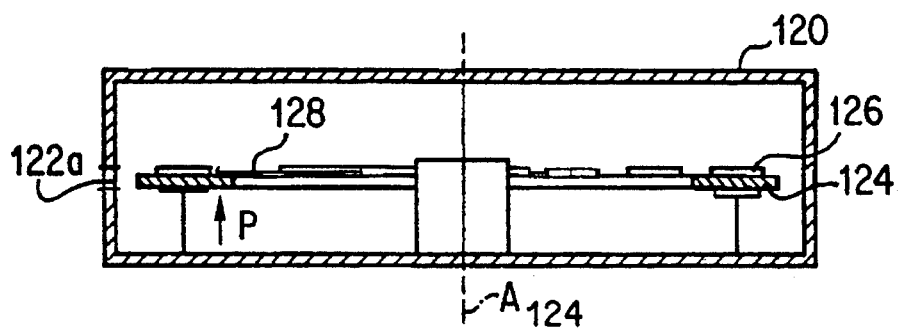
FIG. 5 is a representation that is analogous to that of FIG. 4 of another embodiment of carrousel chamber with radially serviced chamber openings.

A chamber of this type is illustrated schematically in FIGS. 4 and 5. In chamber 120, a carrousel 124 is disposed corresponding to $\omega_1$ so that it can be rotated about an axis $A_{124}$ in a driven manner, workpieces, for example, disk-shaped workpieces 126 of the above-mentioned type, being disposed on the carrousel 124 in holding devices 125. Coaxially with respect to the shaft $A_{124}$, at least one ram 128, disposed in a non-rotatable manner with respect to the chamber 120, is aligned with an opening 122 in the chamber 120 and can be radially displaced with respect to the axis $A_{124}$. By means of this ram 128, a workpiece 126 which, by means of the carrousel, is in each case aligned with one of the openings 122 to be serviced, is pushed out of opening 122 or is moved back onto the carrousel 124 through opening 122. If necessary, the radially displaceable ram or rams 128, as illustrated at $\omega_{2a}$, may be rotationally driven, independently of the carrousel 124, by means of a separate rotary drive $124_m$ indicated by an interrupted line.

In the embodiment which is schematically illustrated in FIG. 5, the carrousel 124 carries the disk-shaped workpieces 126 so that their disk surfaces are rotationally conveyed in planes perpendicularly to the axis of rotation $A_{124}$. The rams 128 are constructed correspondingly and, analogously to the embodiments of FIG. 4, are non-rotatably or independently of the carrousel 124 disposed in the chamber 120 in a rotationally driven manner. In this case, they service radially slot-shaped openings 122a of the chamber 120. The drive of the carrousel 124 may, for example, as illustrated schematically at P, take place in this case peripherally on the edge of the carrousel 124.

3. Rotary transport chambers, in which the workpieces are, on the one hand, rotationally transported about an axis offset with respect to the workpieces, and furthermore are transported individually in the direction in parallel to the axis of rotation.

A chamber of this type is formed by chamber 3 of FIG. 1. In it, the workpieces are axially moved in parallel to the axis of rotation $A_{43}$ by means of the arms 49 which can be moved out and back axially.

4. Rotary transport chambers, in which an axial workpiece movement, as in the case of the chambers of type 3, also takes place but, in addition, a significantly higher number of workpieces are rotationally conveyed on a carrousel than axial-displacement elements are provided for the workpieces.

Figure 6:
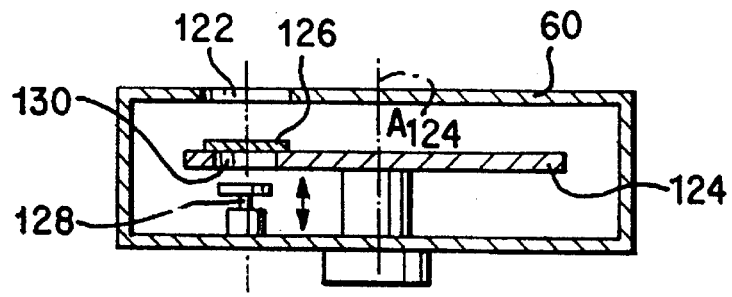
FIG. 6 is a representation analogous to FIG. 4 of a carrousel chamber with axially serviced chamber openings.
Figure 7:
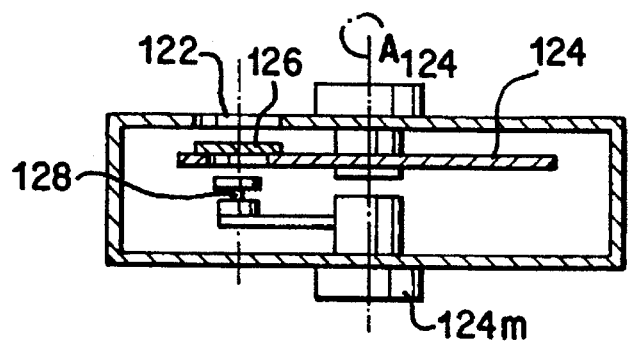
FIG. 7 is a view of another embodiment of the chamber according to FIG. 6.

According to FIGS. 6 and 7, such a chamber 60 has a carrousel 124 which is disposed with respect to the axis of rotation $A_{124}$ in a rotationally driven manner, on which, for example, disk-shaped workpieces 126 are disposed by means of their disk surfaces in the plane of rotation about the axis $A_{124}$. A ram 128, which is aligned with at least one opening 122 on the chamber 60 and can be moved out and back in parallel to the axis $A_{124}$, is fixedly mounted on the housing of chamber 60 and, when the workpiece 126 is rotationally aligned with the opening 122, reaches through a servicing opening 130 on the carrousel 124 and lifts, axially with respect to the axis $A_{124}$, the workpiece 126 toward the opening 122 and moves such a workpiece 126 back from the opening 122 onto the carrousel 124.

While in FIG. 6 the ram or rams 128, as mentioned above, are stationarily mounted on the housing of the chamber 60, according to FIG. 7 and analogously to an embodiment of FIG. 4, they are rotatably in a driven manner with respect to axis $A_{124}$ by means of a separate rotary drive $124_m$, independently of the rotating movement of the carrousel 124 above the same axis. In the case of another embodiment of this type of chamber, the axial stroke can be carried out by the carrousel itself.

5. Rotary transport chambers of this type in which the workpieces are rotationally moved about an axis of rotation and are, in addition, in each case, individually displaced axially with respect to this axis and, in addition, with respect to the above-mentioned axis, are each also individually displaced radially. Such a chamber is formed by chamber 1 of FIG. 1 and 3, together with the transport device 18. On the one hand, workpieces are rotated about the axis $A_{43}$, are in addition, moved axially by means of the axial linear drive of the arms 49, and are also radially displaced by means of the effect of the transport device 18 with respect to the axis $A_{43}$. In particular, in the case of the latter chamber, where the workpieces are displaced axially as well as radially with respect to the above-mentioned axis of rotation, thus in a plane which contains the axis of rotation, such as $A_{124}$, the providing of a swivel transport device is particularly appropriate as implemented by the transport device 18 in the embodiment according to FIG. 1 to 3.

Naturally, the implementation of a radial and axial workpiece transport with respect to the above-mentioned axis of rotation can also be implemented on a carrousel construction, although it requires higher constructional expenditures.

In the following, it will now be explained by means of FIG. 8 how these chamber types may be combined to form chamber combinations with at least two chambers in order to demonstrate the flexible manner in which such chambers may be combined for the construction of whole vacuum treatment facilities. If necessary, additional types of chambers may be added for the construction of whole facilities, to the above-mentioned chamber types which all have in common that the workpieces are rotationally transported about an axis of rotation in the chamber.

In order to be able to briefly refer to the respective chamber types, the following definitions will be used:

a) EASK: Lock-type pass-through chambers by means of which workpieces may be transported through in both directions.

b) ESK: Lock-type pass-through chambers at which workpieces are passed through only in one direction.

c) BEAK: Treatment chambers in which workpieces are surface-treated, for example, etched or coated.

d) RADK: Radially servicing rotary star chambers of type 1, as illustrated in FIGS. 1 to 3 by chamber 1.

e) RAKAK: Radially servicing carrousel chambers of type 2, as schematically illustrated in FIGS. 4 and 5.

f) AXDK: Axially servicing rotary star chambers of type 3, as illustrated by chamber 3 in FIGS. 1 to 3.

g) AXKAK: Axially servicing carrousel chambers of type 4, as schematically illustrated in FIGS. 6 and 7.

h) AXRADK: Rotary star chambers, which permit an axial as well as a radial servicing, of type 5, as illustrated by chamber 3 with the device in FIGS. 1 to 3.

i) TR: Additional transport chambers with two chamber openings, between which workpieces are transported in any manner, for example, a known manner.

Figure 8A:
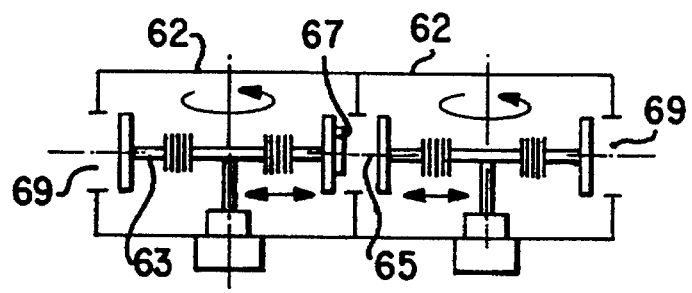
FIGS. 8a to 8f are views of combinations of different chamber types in a minimal configuration for the construction of compact vacuum treatment facilities.

In FIG. 8*a*, two RADK-chamber 62 are combined, comprising one rotationally driven, at least one-armed radially servicing rotary star 63 respectively, by means of which, on the one hand, the connection opening 65 between the two chambers 62 is serviced with workpieces 67 and, on the other hand, additional openings 69 are serviced on which any additional chambers of types a) to i) may be arranged.

In this configuration, the axes of rotation of the transport stars 63 are in parallel and, with respect to the illustrated two chambers 62, the transport takes place essentially in a plane perpendicularly to the above-mentioned axes of rotation.

According to the requirements, by means of the radially displaceable rotary star arms, the openings 65 and 69, which are serviced by them, may be closed in a tight or vacuum-tight manner.

Figure 8B:
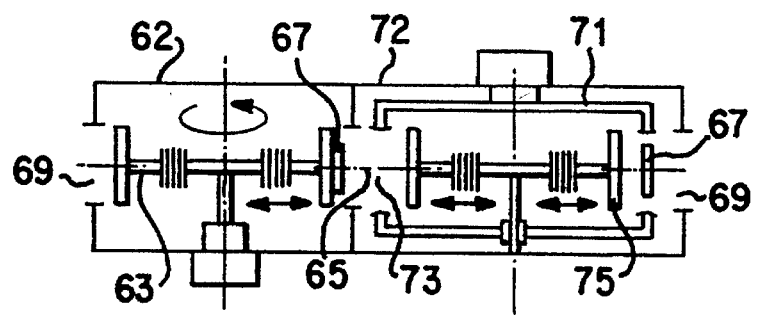

According to FIG. 8*b*, a radially servicing rotary star chamber 62 RADK interacts with a radially servicing RAKAK carrousel chamber. This carrousel chamber has a carrousel 71 which is rotationally driven about an axis, has receiving devices 73 for the workpieces 67, and services, on the one hand, the common opening 65 and, on the other hand, at least one additional opening 69. In the RAKAK chamber 72, in the shown example, radially displaceable rams 75 are provided in a non-rotatable manner which convey and return workpieces 67 from and to the receiving devices 73 on the carrousel to and from the respective openings 65, 69. Here also, the workpieces are conveyed in a plane that is perpendicular to the axes of rotation of the rotary star 63 or the carrousel 71. According to the requirements, the openings 69 and 65 are tightly or vacuum-tightly closed off by the effect of the arms of the rotary star 63 or by that of the rams 75. In this case also, additional chambers of types a) to i) may also be arranged on the openings 69.

It is now easily recognizable that a rotary star chamber 62 according to FIG. 8*b* may be replaced by a second radially servicing carrousel chamber RAKAK 72, whereby a chamber combination is formed of two RAKAK chambers, analogously to the configuration illustrated in FIG. 8*a* for rotary star chambers.

Figure 8C:
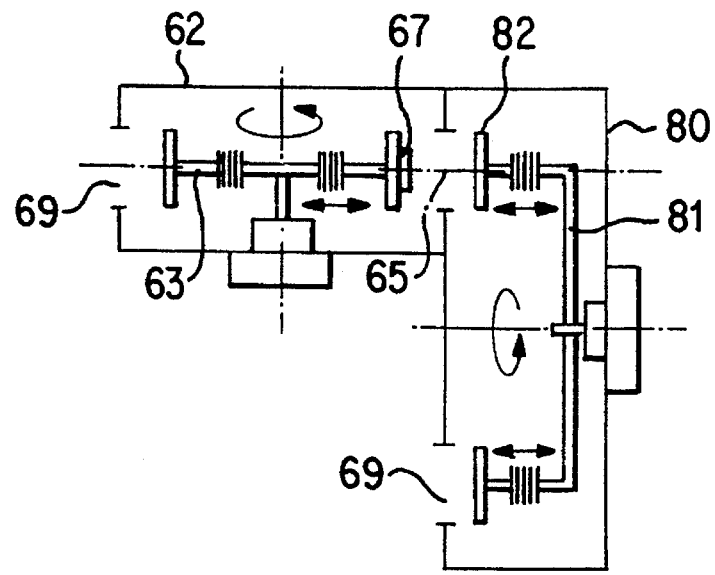

In FIG. 8*c*, a radially servicing rotary star chamber RADK 62 is combined with an axially servicing rotary star chamber AXDK 80. The latter has a rotary star 81, on which rams 82 are arranged which are displaceable in an axially driven manner. By means of the radially displaceable arms of the rotary star 63 and the axially displaceable rams 82 on the rotary star 81, the chamber opening 65 is serviced; by means of the corresponding rotary stars 63 and 81, additional openings 69 on chambers 80 and 62 may be serviced on which additional chambers of types a) to i) may be mounted. As illustrated, a workpiece transport is implemented here in two planes which are perpendicular with respect to one another. According to the requirements, the arms of the rotary star 63 as well as the rams of the rotary star 81 may tightly, if necessary. vacuum-tightly, close off the opening 65 and the openings 69.

It is self-evident that in FIG. 8*c*, instead of a radially acting rotary star chamber RADK 62, an identically acting carrousel chamber RAKAK 72 may be arranged.

Figure 8D:
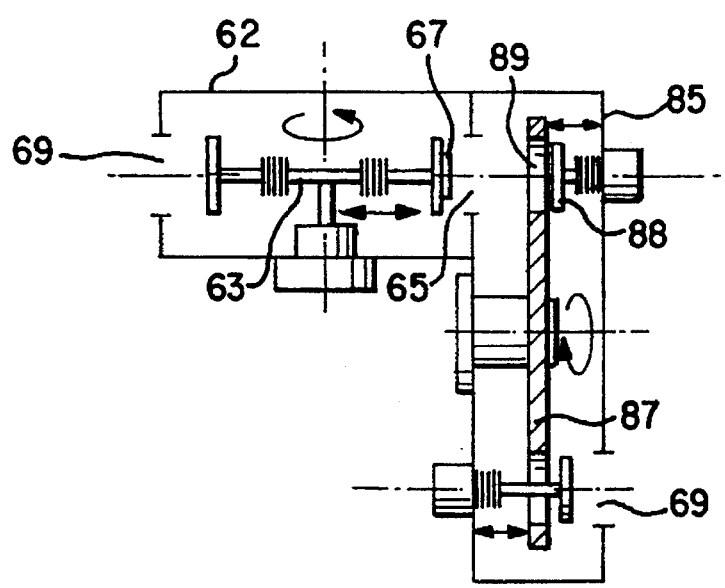

Instead of the axially acting rotary star chambers AXDK 80 of FIG. 8c, in FIG. 8d, an axially acting carrousel chamber AXKAK 85 is provided. It comprises a, for example, disk-shaped carrousel 87 with workpiece receiving devices 89. Axially displaceable rams 88, which are aligned with the opening 65 and the openings 69, lift the workpieces in the workpiece holding devices 89 out of the carrousel to the above-mentioned openings and return them into the holding devices 89. In this case also, the workpiece transport takes place in two perpendicular planes. The arms of the rotary star 63 and the rams 88 may, according to the requirements, close off the openings 65 and 69 in a tight or vacuum-tight manner. Also in this case, additional chambers of types a) to i) may be connected to the openings 69.

Figure 8E:
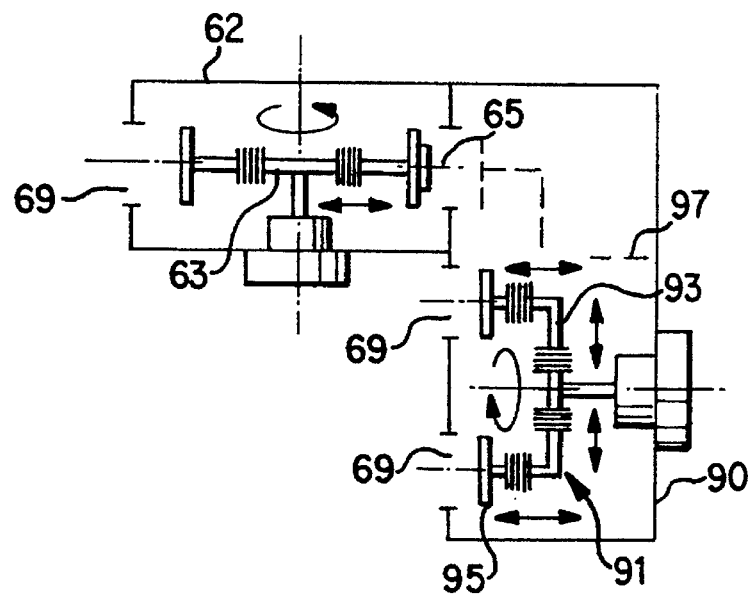

It is easily recognizable in FIG. 8e that the radially acting rotary star chamber RADK 62 may be replaced by a radially acting carrousel chamber RAKAK 72 according to FIG. 8b.

FIG. 8e represents a configuration which consists of a radially acting rotary star chamber RADK 62 and an axially and radially acting rotary star chamber AXRADK 90. The latter has a rotary star 91 which, on one side, comprises arms 93 which can be moved out radially, on which rams 95 are disposed which can be moved out and returned axially.

When this embodiment is compared with that of FIG. 8c, where only axially displaceable rams 82 are provided, a significant advantage of the configuration according to FIG. 8e is illustrated. While chamber 80 of FIG. 8c in its diameter must be dimensioned with respect to the axis of rotation of the star 81, specifically such that the opening 65 can be serviced by an axial displacement of the rams 82, in the case of the embodiment according to FIG. 8e, the diameter of the chamber 90 with respect to the axis of rotation of the star 91 may be selected to by only so large that the openings 69 can be serviced. Only in, for example, one rotating position of the rotary star 61, the corresponding arm 93 can be moved out radially in order to service opening 65 by means of a subsequent axial displacement. As indicated by an interrupted line at reference number 97, this results in the possibility of servicing the opening 65 by way of an intermediate chamber which lets the diameter of the chamber 90 with respect to the axis of rotation of the star 91 project out, as mentioned above, only in an angular position.

With respect to the tight closing-off of the openings 69 and 65, the statements concerning FIGS. 8a to d will also apply here. Furthermore, it is stressed that the implementation of the axial and radial transport displacements on chamber 90 is also possible in different variants, thus also by the inclusion of additional transport devices, as implemented, for example and preferably, by means of the swivel transport device 18 in the embodiment according to FIGS. 1 to 3.

It is easily recognizable that in the embodiment according to FIG. 8e, instead of a radially acting turntable chamber RADK 62, a radially acting carrousel chamber RAKAK 72 according to FIG. 8b may be provided.

Figure 8F:
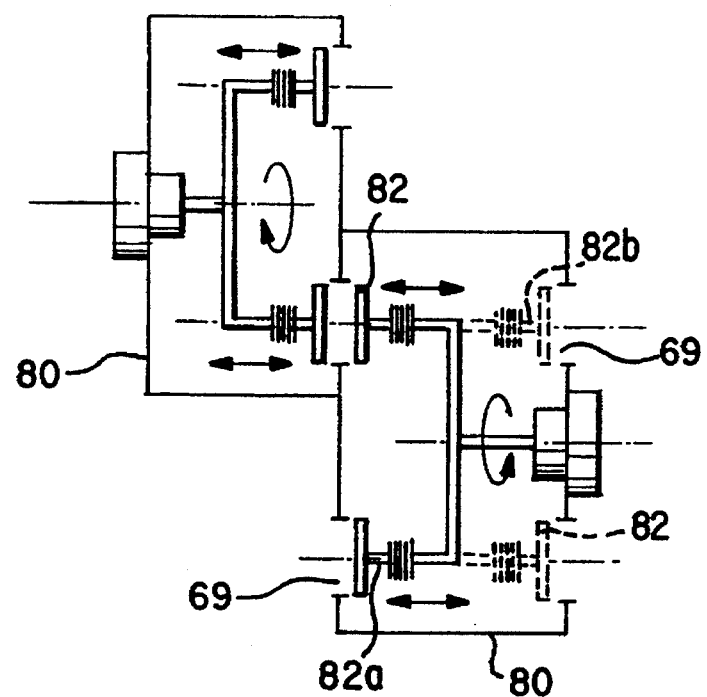

FIG. 8f illustrates the combination of two axially servicing rotary star chambers AXDK 80. The method of operation is easily recognizable. It is also illustrated by an interrupted line that axially displaceable rams 82 may be arranged in pairs 82a and 82b so that by means of such rams and by means of the same rotary star, openings 69 may be serviced which are arranged on two sides of the plane of rotation. The same technique may naturally also be implemented according to FIG. 8e for rotary stars AXRADK with a radial and axial advance.

As easily recognizable, it is possible without any problems to provide on the arrangement according to FIG. 8f, instead of one of the AXDK chambers 80, an AXRADK chamber 85 according to FIG. 8d. It is also demonstrated that the coupling of two AXKAK chambers according to chamber 85 of FIG. 8d is easily possible. It is also easily possible to provide a chamber AXRADK 90 according to FIG. 8e on an AXDK chamber 80 according to, for example, FIG. 8c. Also possible is the combination of an AXKAK chamber 85 according to FIG. 8d with an AXRADK chamber 90 according to FIG. 8e.

If, in the case of the above-mentioned and described chamber combinations, the individual chambers are each to be conditioned separately, it is self-evident that respective pump connections and, if required, gas inlets, will be provided leading to the respective individual chambers.

By means of the described chamber combinations, extremely compact overall facilities may also be combined in a modular manner, with an optimally short transport path and short transport cycles.

The described approach and the described facility are particularly suitable for the treatment of magnetic storage disks, such as CD's or hard disks.

I claim:

1. A vacuum chamber arrangement with a transport chamber for transporting at least one workpiece under vacuum condition, said transport chamber comprising a transport device; at least one workpiece holder; at least two openings in a wall of said chamber for handling a workpiece therethrough, wherein said transport device is movable in said chamber along a first plane and is driven by a transport drive, and said at least one workpiece holder is swivellably mounted on said transport device and swivellable along a second plane which intersects said first plane and driven by a swivel drive; and said transport device and said holder are operatively arranged so that said holder is movable by said transport device adjacent to at least one of said openings and is swivellable through said at least one opening.

2. A vacuum transport chamber comprising a transport device; at least one workpiece holder; at least two openings in a wall of said chamber for handling a workpiece therethrough, wherein said transport device is movable in said chamber along a first plane and is driven by a transport drive, and said at least one workpiece holder is swivellably mounted on said transport device and swivellable along a second plane which intersects said first plane and driven by a swivel drive; and said transport device and said holder are operatively arranged so that said holder is movable by said transport device adjacent to at least one of said openings and is swivellable through said at least one opening.

3. The arrangement of claim 2, wherein said holder is controlled for gripping and releasing a workpiece.

4. The arrangement of claim 3, wherein a plane defined by said two tongues of said fork is parallel to said second plane.

5. The arrangement of claim 2, wherein said holder has the shape of a two-tongue fork for gripping a workpiece between said two tongues.

6. The arrangement of claim 2, wherein said holder is swivellable around an axis, and said axis is linearly movable along said transport device towards and from said at least one opening.

7. The arrangement of claim 6, wherein said swivel drive constitutes a drive for linearly driving said axis.

8. The arrangement of claim 2, wherein said second plane is perpendicular to said first plane.

9. The arrangement of claim 2, wherein said at least one opening has a diameter in said second plane when said holder is moved adjacent said at least one opening by said transport device, which diameter is substantially larger than a second diameter of said at least one opening disposed perpendicularly to said one diameter.

10. The arrangement of claim 2, wherein said transport device comprises at least one arm rotatable around an axis by said transport drive.

11. The arrangement of claim 10, wherein said arm is movable in a radial direction and carries, opposite to said axis, said at least one workpiece holder.

12. The arrangement of claim 11, wherein said arm is movable in the radial direction via said swivel drive.

13. The arrangement of claim 2, comprising a closing member, said closing member being synchronously movable with said at least one holder and towards said at least one opening as said holder is swivelled therethrough to at least substantially reduce an area with which said opening communicates with an interior of said chamber.

14. The arrangement of claim 13, wherein said holder and said closing member are linearly movable with respect to said transport device to and from said at least one opening.

15. The arrangement of claim 2, wherein one of a load-lock chamber, a further transport chamber or a treatment station for vacuum treatment of a workpiece communicates with said transport chamber through said at least one opening.

16. The arrangement of claim 2, wherein said holder is configured to leave a major portion of a surface of a workpiece thereon unobstructed.

17. The arrangement of claim 2, further comprising a further transport chamber communicable with said one transport chamber through said at least one opening, said further transport chamber comprising a further transport device rotatable around an axis perpendicular to said second plane with at least one further workpiece holder.

18. The arrangement of claim 17, wherein said further transport device comprises at least two workpiece holders rotatable around said axis.

19. The arrangement of claim 18, wherein said at least two holders are positioned on a drivingly expandable transport arm, each extending parallel to said axis.

20. The arrangement of claim 18, wherein said further chamber comprises at least one opening with an opening axis parallel to said axis.

21. The arrangement of claim 20, wherein said at least one opening communicates with an intermediate chamber which is arranged to communicate by said at least one opening with an opening axis parallel to said axis with said further chamber.

22. The arrangement of claim 21, wherein said holder and said further holder are coupled to a respective closing member for closing said at least one opening and said opening, the axes of which are parallel to said axis, said intermediate chamber being a load-lock type pass-through chamber between said transport chamber and said further transport chamber.

23. The arrangement of claim 22, further comprising a pump connection to said intermediate chamber.

24. The arrangement of claim 18, wherein said further workpiece holder is coupled to a closing member for closing said at least one opening with an opening axis parallel to said axis to at least substantially reduce the area with which said at least one opening communicates with the inside of said further chamber.

25. The arrangement of claim 18, wherein said further chamber comprises a further opening, the axis thereof being directed parallel to said axis and extending across a wall of said further chamber to ambient environment, said further chamber comprising a closing device cooperating with said further opening outside said chamber to close said further opening in a vacuum-tight manner, said further holder being coupled with a further closing device for closing said further opening in a vacuum-tight manner from the inside of said further chamber, said further opening with its extent across said wall portion being a load-lock chamber.

26. The arrangement of claim 25, comprising a pump connection at least at one of said transport chamber, said further transport chamber and said load-lock chamber.

27. The arrangement of claim 18, wherein said further chamber comprises a further opening communicated with one of a load-lock chamber, a transport chamber and a treatment station for vacuum surface treatment of a workpiece.

28. The vacuum transport chamber according to claim 2, wherein at least two workpiece holders are provided, said at least two workpiece holders being swivellably mounted around separate swivel axes and driven by a swivel drive arrangement.

29. The vacuum transport chamber of claim 28, wherein said swivel drive arrangement comprises an independently controllable swivel drive for each of said at least two workpiece holders.

30. A vacuum transport chamber comprising a transport device; at least two workpiece holders; at least two openings in a wall of said chamber for handling a workpiece therethrough, wherein said transport device is movable in said chamber along a first plane and is driven by a transport drive, and said at least two workpiece holders are swivellably mounted on said transport device and swivellable around separate swivel axes along a second plane which intersects said first plane and driven by a swivel drive; and said transport device and said holder are operatively arranged so that said holder is movable by said transport device adjacent to at least one of said openings and is swivellable through said at least one opening.

* * * * *